(12) United States Patent
Vo et al.

(10) Patent No.: US 9,966,508 B2
(45) Date of Patent: May 8, 2018

(54) METHODS FOR FABRICATING QUANTUM DOT POLYMER FILMS

(71) Applicant: Nanoco Technologies Ltd., Manchester (GB)

(72) Inventors: Cong-Duan Vo, Manchester (GB); Imad Naasani, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 385 days.

(21) Appl. No.: 14/638,578

(22) Filed: Mar. 4, 2015

(65) Prior Publication Data

US 2015/0255690 A1    Sep. 10, 2015

Related U.S. Application Data

(60) Provisional application No. 61/947,736, filed on Mar. 4, 2014.

(51) Int. Cl.
| | |
|---|---|
| C09K 11/02 | (2006.01) |
| H01L 33/50 | (2010.01) |
| C09K 11/88 | (2006.01) |
| B82Y 40/00 | (2011.01) |
| B82Y 20/00 | (2011.01) |

(52) U.S. Cl.
CPC ............ *H01L 33/507* (2013.01); *C09K 11/02* (2013.01); *C09K 11/883* (2013.01); *H01L 33/501* (2013.01); *B82Y 20/00* (2013.01); *B82Y 40/00* (2013.01); *Y10S 977/774* (2013.01); *Y10S 977/897* (2013.01); *Y10S 977/95* (2013.01)

(58) Field of Classification Search
CPC ..................................................... C09K 11/02
See application file for complete search history.

(56) References Cited

U.S. PATENT DOCUMENTS

| | | |
|---|---|---|
| 8,513,172 B2 | 8/2013 | Baum et al. |
| 2006/0199039 A1 | 9/2006 | Park et al. |
| 2009/0050850 A1 | 2/2009 | Kukui et al. |
| 2009/0118150 A1 | 5/2009 | Baum et al. |
| 2010/0152326 A1* | 6/2010 | Kurz ............... C08J 3/2053 523/339 |
| 2011/0068321 A1 | 3/2011 | Pickett et al. |

FOREIGN PATENT DOCUMENTS

| | | |
|---|---|---|
| EP | 2371926 A2 | 10/2011 |
| JP | 20151214702 A | 7/2015 |
| WO | 2016035602 A1 | 10/2016 |

OTHER PUBLICATIONS

Dilag. CdS/polymer nanocomposites synthesized via surface initiated RAFT polymerization for the fluorescent detection of latent fingermarks. Forensic Science International 228 (2013) 105-114.*
Vo, C-D, et al., (2007), "RAFT Synthesis of Branched Acrylic Copolymers", Macromolecules, 40 (20), pp. 7119-7125.
Vo, C-D, et al., (2010), "Stimulus-Responsive Polymers Based on 2-Hydroxypropyl Acrylate Prepared by RAFT Polymerization", Journal of Polymer Science Part A, Polymer Chemistry.
Dilag, Jessirie et al. "CdS/polymer nanocomposites synthesized via surface initiated RAFT polymerization for the fluorescent detection of latent fingermarks", Forensic Science International, © 2013 Elsevier Scientific Publishers Ireland Ltd. All rights reserved., vol. 228, No. 1, Mar. 27, 2013, pp. 105-114.
Skaff, H., et al., (2004), "Reversible Addition Fragmentation Chain Transfer (RAFT) Polymerization from Unprotected Cadmium Selenide Nanoparticles", Angew. Chem. Int. Ed., vol. 43, pp. 5383-5386.

* cited by examiner

*Primary Examiner* — Matthew E Hoban
(74) *Attorney, Agent, or Firm* — Blank Rome, LLP

(57) ABSTRACT

The addition of a chain transfer agent (CTA) or a reversible-addition fragmentation chain transfer agent (RAFT CTA) such as (2-(dodecyl-thiocarbonothioylthio)-2-methylpropionic acid) during the formation of quantum dot polymer films yields films characterized by high and stable quantum yields.

14 Claims, 11 Drawing Sheets

METHODS FOR FABRICATING QUANTUM DOT POLYMER FILMS

CROSS-REFERENCE TO RELATED APPLICATIONS

This application claims the benefit of U.S. Provisional Application No. 61/947,736 filed on Mar. 4, 2014.

STATEMENT REGARDING FEDERALLY SPONSORED RESEARCH OR DEVELOPMENT

Not Applicable

BACKGROUND OF THE INVENTION

1. Field of the Invention

The present invention generally relates to the fabrication of high-quality, quantum dot-based films. More particularly, but not exclusively, it relates to the fabrication of high-quality quantum dot polymer films using a chain transfer agent as an additive during manufacturing.

2. Description of the Related Art Including Information Disclosed Under 37 CFR 1.97 and 1.98

There has been substantial interest in exploiting compound semiconductors having particle dimensions on the order of 2-50 nm, often referred to as quantum dots (QDs), nanoparticles, and/or nanocrystals. These materials have high commercial interest due to their size-tunable electronic properties, which can be exploited in a broad range of commercial applications. Such applications include optical and electronic devices, biological labeling, photovoltaics, catalysis, biological imaging, light emitting diodes (LEDs), general space lighting, and electroluminescent displays.

Well-known QDs are nanoparticles comprising metal chalcogenides (e.g, CdSe or ZnS). Less-studied nanoparticles include III-V materials, such as InP, and including compositionally graded and alloyed dots. QDs typically range from 2 to 10 nanometers in diameter (about the width of 50 atoms), but may be larger, for example up to about 100 nanometers. Because of their small size, quantum dots display unique optical and electrical properties that are different in character to those of the corresponding bulk material. The most immediately apparent optical property is the emission of photons under excitation. The wavelength of these photon emissions depends on the size of the quantum dot.

The ability to precisely control quantum dot size enables a manufacturer to determine the wavelength of its emission, which in turn determines the color of light the human eye perceives. Quantum dots may therefore be "tuned" during production to emit light of a desired color. The ability to control or "tune" the emission from the quantum dot by changing its core size is called the "size quantization effect." The smaller the QD, the higher the energy, i.e., the more "blue" its emission is. Likewise, larger QDs emit light more toward the electromagnetic spectrum's red end. Dots may even be tuned beyond visible light into the spectrum's infra-red or ultra-violet band. Once synthesized, quantum dots are either in powder or solution form. Because of their tiny size, the ability to produce even a relatively "small" volume of quantum dots (e.g., one kilo) will yield enough actual quantum dots for industrial scale applications.

A particularly attractive application for quantum dots is in the development of next generation LEDs. LEDs are becoming increasingly important in modern day life, and it's predicted that they have the potential to become a major target for quantum dot applications. Quantum dots can enhance LEDs in a number of areas, including automobile lighting, traffic signals, general lighting, liquid crystal display (LCD) backlight units (BLUs), and display screens. At present, LED devices are made from inorganic solid-state compound semiconductors, such as GaN (blue), AlGaAs (red), AlGaInP (orange-yellow-green), and AlGaInN (green-blue). Unfortunately, the technology does not yet exist to produce solid-state LEDs that emit white light. One solution is to combine solid-state LEDs of different frequencies to produce a white light; however, it's difficult and expensive to produce "pure" colors. Alternatively, solid-state LEDs can be down-converted to white light by placing a combination of phosphor materials on top of the LEDs. The light from the LED (the "primary light") is absorbed by the phosphor material and re-emitted at a second frequency (the "secondary light"), which produces a white light. Down-converted LEDs cost less and are simpler to fabricate than LED combinations; however, conventional phosphor technology produces light with poor color rendering (i.e. a color rendering index (CRI)<75).

Quantum dots are a promising alternative to conventional phosphor technology. First, their emission wavelength can be tuned by manipulating nanoparticle size. Second, so long as the quantum dots are monodispersed, they exhibit strong absorption properties, narrow emission bandwidth, and low scattering. Rudimentary quantum dot-based light-emitting devices have been manufactured by embedding colloidally produced quantum dots in an optically transparent (or sufficiently transparent) LED encapsulation film, such as silicone or an acrylate, which is then placed in the light path of a solid-state LED to produce a white light. This quantum dot method is robust, relatively inexpensive, and it produces light with good color rendering. However, the method is not without its disadvantages. For example, quantum dots can agglomerate when formulated into LED encapsulation films, thereby reducing their optical performance. Furthermore, even if the quantum dots are successfully incorporated into the LED encapsulation film, oxygen can still migrate through the film to the surfaces of the quantum dots, which can lead to photo-oxidation and, as a result, a drop in quantum yield (QY). Finally, current LED encapsulation films are brittle, which makes them difficult to process and handle during film manufacturing.

Thus, there is need in the art for a method to fabricate high quality quantum-dot based films that are both robust and resistant to photo-oxidation.

BRIEF SUMMARY OF THE INVENTION

It has been found that the addition of a chain transfer agent (CTA) or a reversible-addition fragmentation chain transfer agent (RAFT CTA) such as (2-(dodecylthiocarbonothioylthio)-2-methylpropionic acid) during the formation of quantum dot polymer films yields films characterized by high and stable quantum yields.

BRIEF DESCRIPTION OF THE SEVERAL VIEWS OF THE DRAWING(S)

The foregoing summary, as well as the following detailed description, will be better understood when read in conjunction with the drawing figures. For the purpose of illustration only, there is shown in the drawings certain embodiments. It should be understood, however, that the inventive concepts disclosed herein are not limited to the precise arrangements and instrumentalities shown in the figures.

FIG. 1 illustrates a method for fabricating a quantum dot film with a chain-transfer agent, in accordance with one embodiment of the invention.

FIG. 2 contains photographs of red-QD polymer films fabricated with and without CTA, in accordance with an embodiment of the invention.

FIG. 3 is a plot of the quantum yield over time of red-QD samples fabricated with and without CTA, in accordance with an embodiment of the invention.

FIG. 4 graphically illustrates the quantum yield over time of quantum dot films fabricated with and without RAFT CTA, in accordance with an embodiment of the invention.

Figure 7:
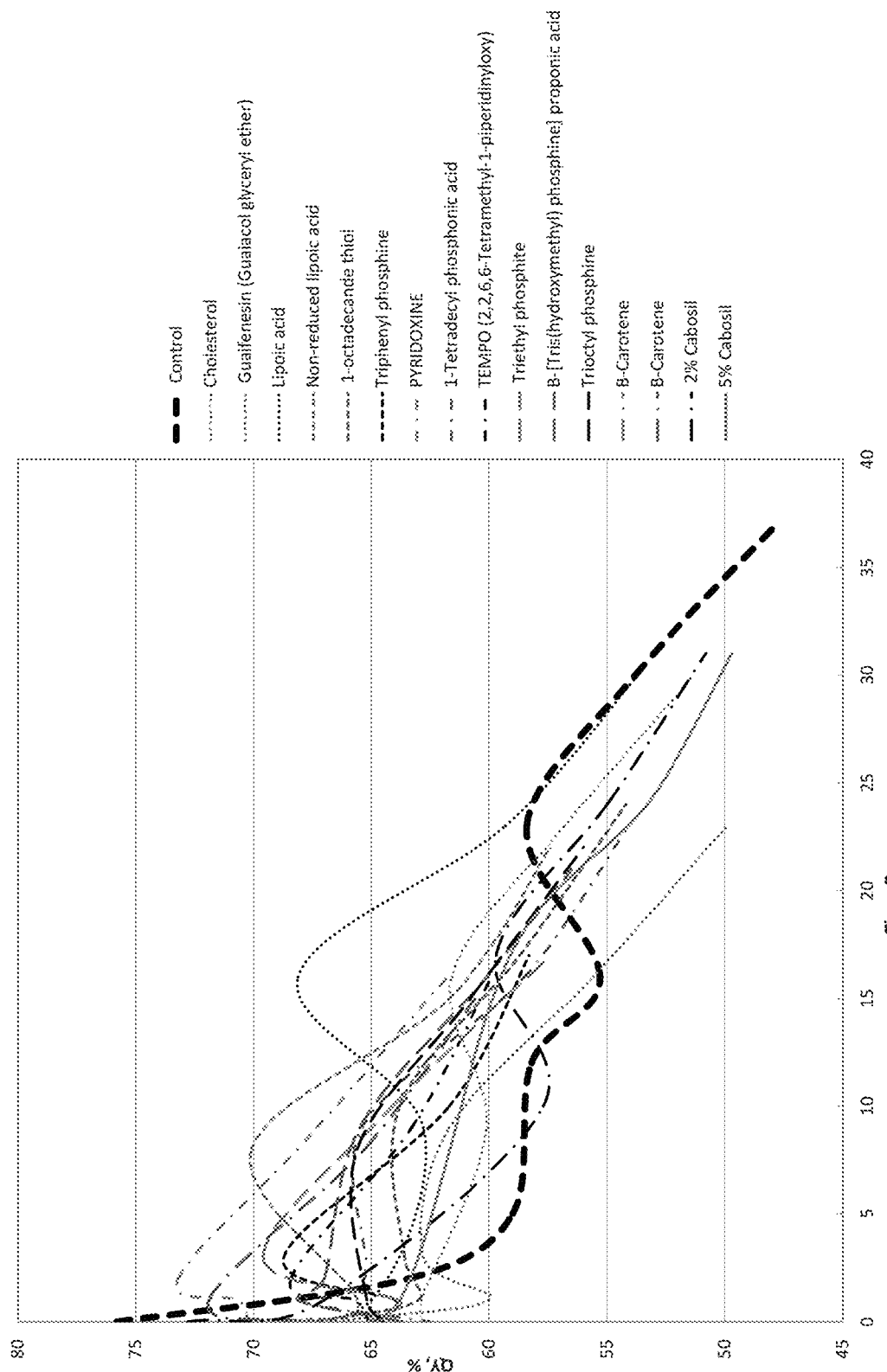

FIG. 7 graphically illustrates the quantum yield over time of QD films made with non-RAFT CTA radical scavengers, in accordance with an embodiment of the invention.

Figure 8:
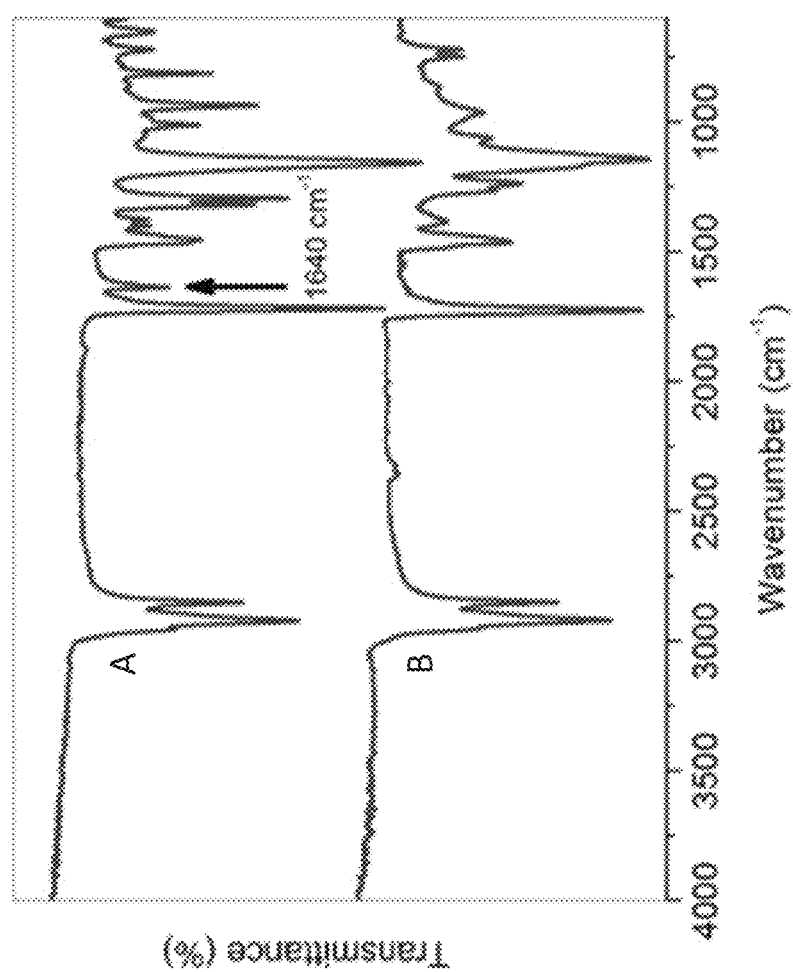

FIG. 8 presents IR spectra of red-QDs fabricated with RAFT CTA, in accordance with an embodiment of the invention.

DETAILED DESCRIPTION OF THE INVENTION

Before explaining at least one embodiment in detail, it should be understood that the inventive concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other invented systems, methods, features, and advantages will be or become apparent to one with skill in the art upon examining the drawings and the detailed description herein. It's intended that all such additional systems, methods, features, and advantages be protected by the accompanying claims.

All references cited in this application are incorporated by reference in their entirety.

The term "quantum dot" as used in this application is not meant to be limiting, and can refer to any quantum dot type or any quantum dot combination. For example, the term "quantum dot" may refer to, without limitation, quantum dots or combinations of quantum dots derived from the following materials: Alloys (e.g., CdSeTe, PbSeTe, CdZnSe, $CuInS_2$, $CuInSe_2$, $AgInS_2$), Group II-VI nanoparticles (e.g., CdS, CdSe, ZnS, ZnSe), Group III-V nanoparticles (e.g., InP, GaP), Group II-V nanoparticles (e.g., $Cd_3P_2$), and Group III-VI nanoparticles (e.g., $In_2Se_3$). In another embodiment, the term "quantum dot" can refer to one or more cadmium-free quantum dots or core-shell quantum dots of any type. In yet another embodiment, the term "quantum dot" can refer to green-emitting quantum dots, red-emitting quantum dots, or a combination of green- and red-emitting quantum dots. In still another embodiment, the term "quantum dot" can refer to a mixture of quantum dots at a concentration that can effectively down-convert the primary light emitted by an LED to produce white light emissions. The term "quantum dot" is abbreviated herein as "QD."

The present application is generally directed to the fabrication of quantum dot polymer films. More particularly, the present application is directed to the fabrication of high-quality quantum dot films that are protected from free radical damage.

In one embodiment, quantum dot polymer films are fabricated with the addition of a chain transfer agent. In another embodiment, quantum dot polymer films are fabricated with the addition of a reversible-addition fragmentation chain transfer agent (RAFT CTA). In yet another embodiment, quantum dot polymer films manufactured in accordance with the embodiments herein are characterized by high and stable quantum yields.

Figure 1:
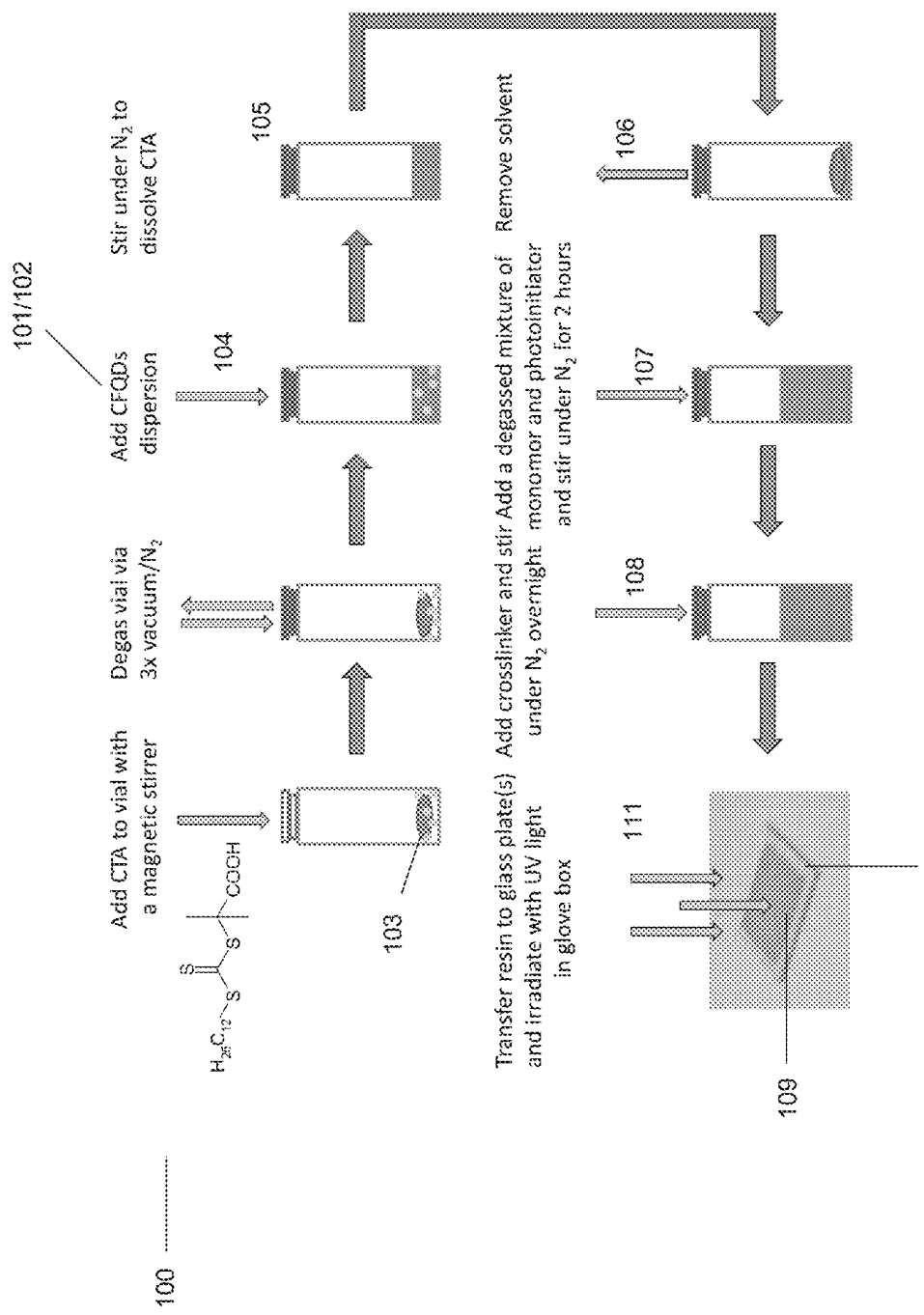

FIG. 1, by way of example only, illustrates a method 100 for fabricating a high-quality quantum dot film. In one embodiment, the films are made of any type of quantum dot described herein. In another embodiment, the films are made of red-QDs. The quantum dots 101 can be dispersed in a solvent 102 of any type, including but not limited to toluene, aliphatic hydrocarbon-based solvents, etc. This quantum dot dispersion can then be combined 104 with one or more chain transfer agents 103 or combinations of chain transfer agents of any type. In one embodiment, the chain transfer agents can be one or more RAFT CTAs, including but not limited to thiocarbonylthio compounds such as dithiobenzoates, dithioesters, dithiocarbamates, trithiocarbonates, and xanthates. In yet another embodiment, the RAFT CTA includes one or more carboxyl-terminated trithiocarbonates.

Referring again to FIG. 1, after combining the quantum dot dispersion and chain transfer agents 104 the mixture can be stirred under $N_2$ gas 105 and then the solvent can be removed 106 (e.g., via evaporation). The resulting suspension can then be re-dispersed 107 in a mixture of one or more methyl(acrylate) resins. In one embodiment, the methyl (acrylate) resins can include, but are not limited to, acrylate monomers, acrylate cross-linkers, acrylate photoinitiators, or thermal initiators. Acrylate monomers and cross-linkers may include, but are not limited to, LMA, isobornyl (meth) acrylate, tert-butyl (meth)acrylate, pentaerythritol di-(meth) acrylate monostearate, and trimethyloyl propane triacrylate. Acrylate photoinitiators may include, but are not limited to, IRGACURE® 819 (BASF SE COMPANY FED REP GERMANY CARL-BOSCH-STR. 38 LUDWIGSHAFEN FED REP GERMANY 67056), IRGACURE 651, IRGACURE 184, IRGACURE 784, IRGACURE 2959, IRGACURE 907, IRGACURE 369, DAROCUR® 1173 (BASF SE COMPANY FED REP GERMANY CARL-BOSCH-STR. 38 LUDWIGSHAFEN FED REP GERMANY 67056), TPO [2,4,6-Trimethylbenzoyl-diphenylphosphine oxide] and MBF [Methyl benzoylformate]. Thermal initiators may include, but are not limited to, AIBN [2,2'-Azobis(2-methylpropionitrile)] or benzoyl peroxide. In yet another embodiment, the quantum-dot CTA suspension can be combined with a methyl(acrylate) resin mixture that includes lauryl methacrylate (LMA) as a monomer, and phenylbis(2,4,6 trimethyl benzoyl)phosphine oxide (IRGACURE 819) as a photoinitiator. The suspension can be stirred under $N_2$ gas for 2 hours. Next, a crosslinker, such as trimethyloylpropane trimethacrylate (TMPTM), can be added to the mixture 108 and stirred under $N_2$ gas overnight.

Combining the quantum dot CTA suspension with a methyl(acrylate) resin can produce a resulting resin 109. This resin 109 can then be transferred to a substrate 110 and irradiated with UV light 111 to cure the resin 109 to a quantum dot polymer film. In an embodiment, the quantum dot polymer film is substantially flexible. In still another embodiment, then quantum dot polymer film is characterized by a high quantum yield. In yet another embodiment, the quantum dot polymer film is both substantially flexible and is characterized by a high and stable quantum yield (QY). In another embodiment, the method can produce a red-QD polymer film that is characterized by a high and stable quantum yield.

Figure 2:
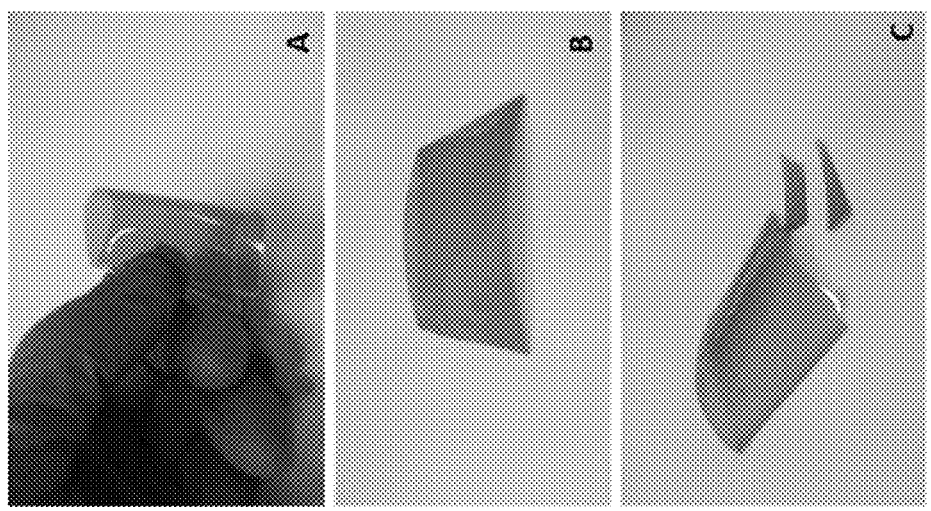

Photos A and B in FIG. 2 illustrate a red-QD polymer film fabricated in accordance with the embodiments described in FIG. 1. As illustrated in FIG. 2, in an embodiment, the fabrication techniques can produce a red-QD polymer film that is substantially flexible. In another embodiment, this film flexibility is a by-product of the addition of a chain transfer agent to the quantum dot polymer film fabrication methods. On the other hand, photo C in FIG. 2 illustrates a red-QD polymer film that is fabricated without the addition of a chain transfer agent. As illustrated, the resulting polymer film is brittle, and shears when bended.

Figure 3:
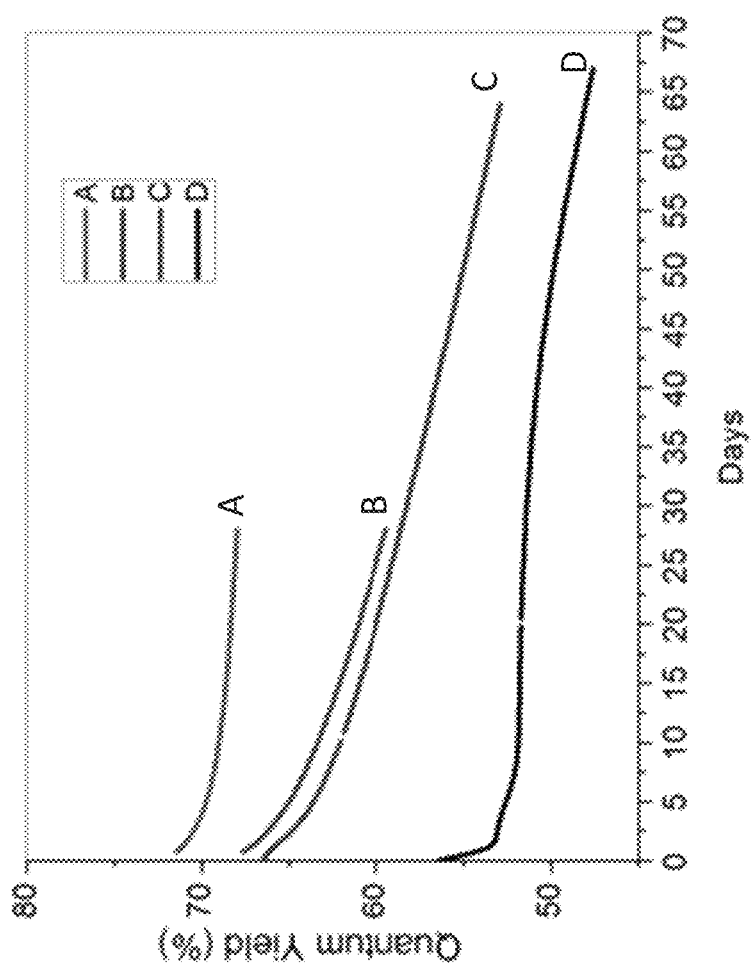

FIG. 3 is a plot of the quantum yield over time of two red-QD samples (A & C) fabricated with RAFT CTA (described in FIG. 1) and two red-QD control samples (B & D) fabricated without the addition of RAFT CTA (photoluminescence quantum yield measured using a Hamamatsu Quantaurus-QY spectrometer). As illustrated, in an embodiment, the fabrication techniques described herein can produce QD polymer films that are characterized by high and stable quantum yields. For example, samples A and B are derived from the same batch of QDs. Sample A is additionally fabricated with 0.5% mol RAFT CTA, while sample B is a control and is not fabricated with RAFT CTA. As illustrated, in an embodiment, sample A shows significantly higher and more stable quantum yields than sample B. Similarly, samples C and D are also derived from the same batch of QDs. Sample C is additionally fabricated with 0.5% RAFT CTA, while sample D is a control and is not fabricated with RAFT CTA. As illustrated, sample C shows significantly higher and more stable quantum yields than sample D.

Figure 4:
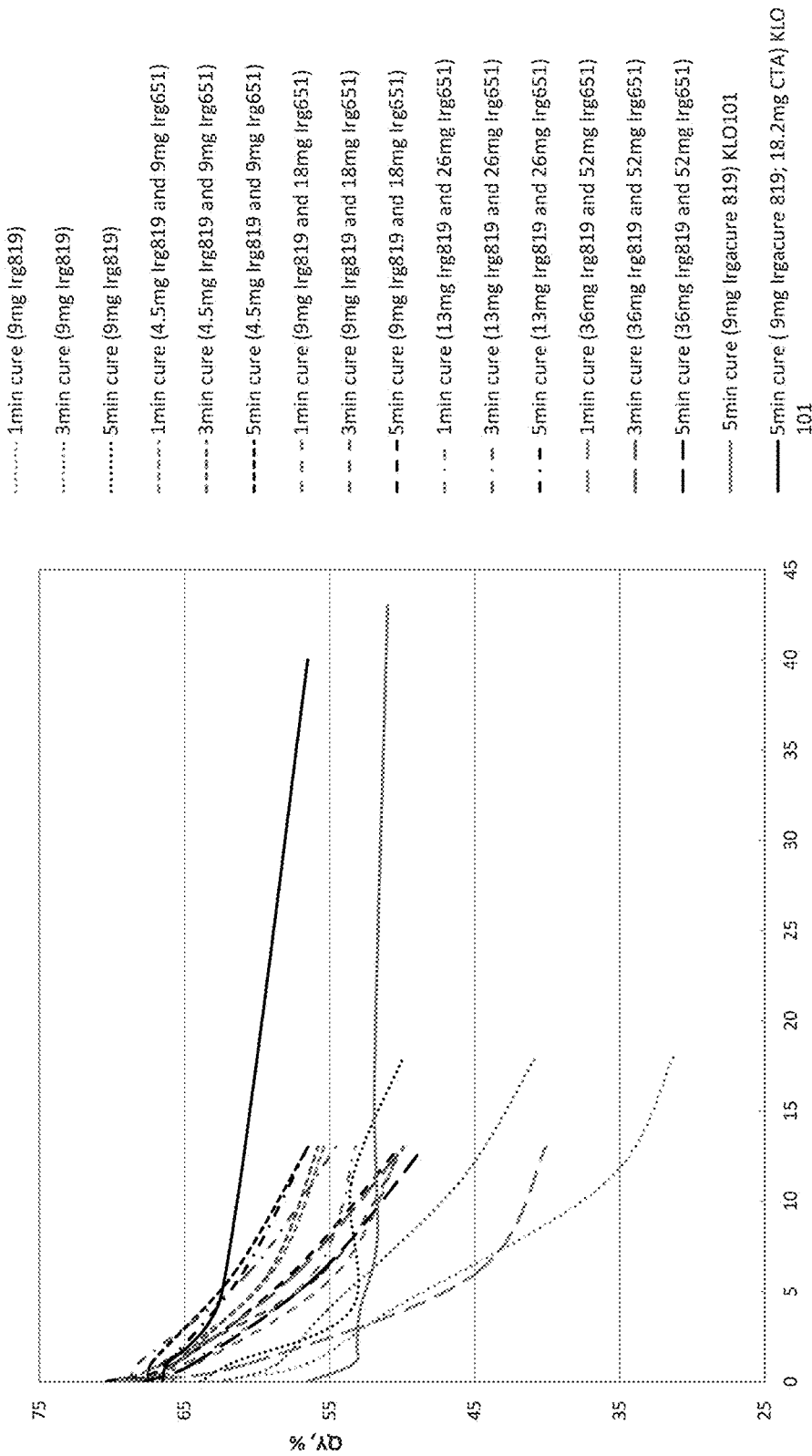

FIG. 4 illustrates the quantum yield over time of quantum dot films fabricated with RAFT CTA (black solid line) and quantum dots fabricated without RAFT CTA (all other colors) with varying photoinitiator concentrations. The data illustrates that RAFT CTA provides substantially higher QY and stability to the films compared to those films prepared without RAFT CTA and at varying photoinitiator concentrations.

Figure 5:
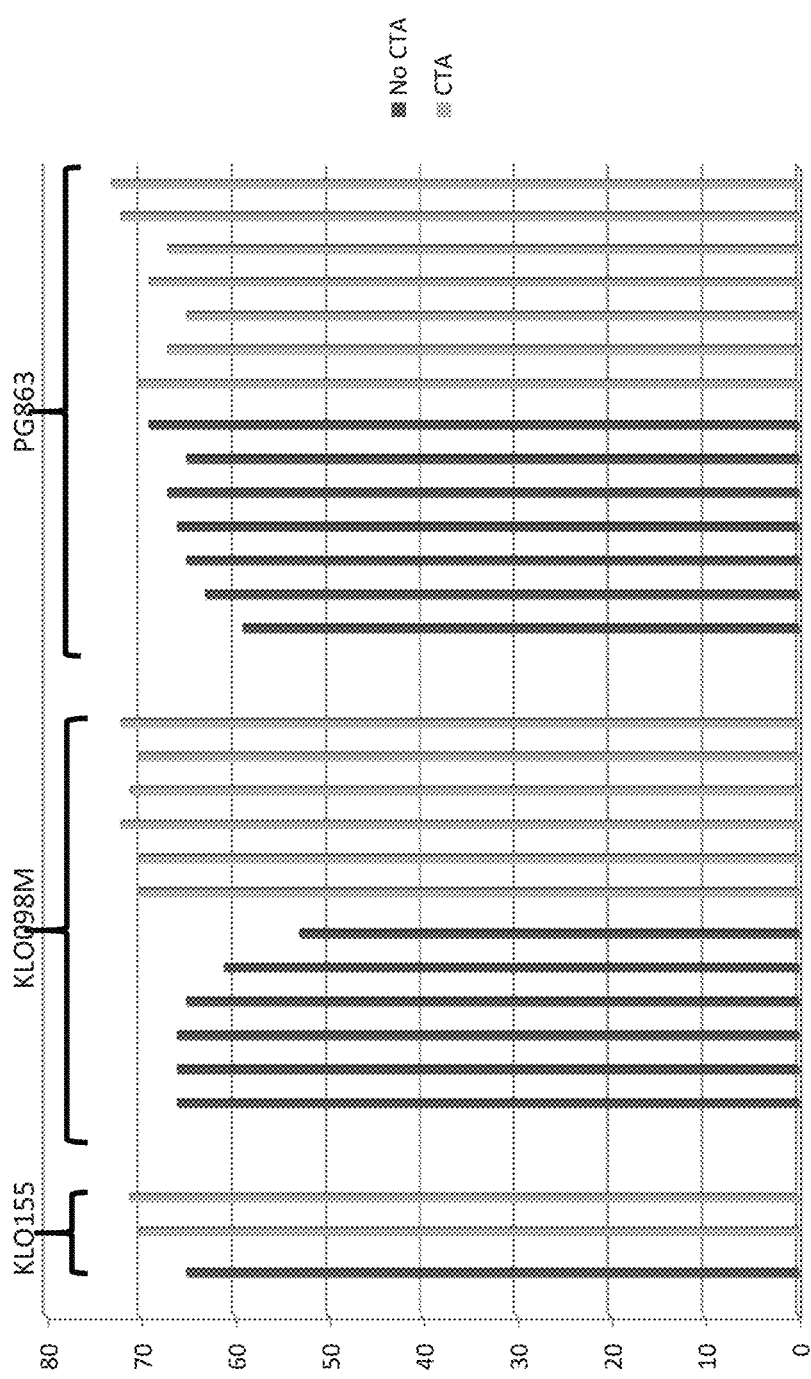
FIG. 5 is a graph of the quantum yield of three red-QD samples fabricated with and without RAFT CTA, in accordance with an embodiment of the invention.

FIG. 5 is a graph showing the quantum yield (in %) of three red-QD samples (KLO155, KLOO98M, and PG863) fabricated with RAFT CTA (light grey line) (described in FIG. 1) and without RAFT CTA (measured by Hamamatsu). As illustrated, in an embodiment, the fabrication techniques described herein can produce QD polymer films that are characterized by initial high quantum yields. For example, when the three samples are fabricated with RAFT CTA (light grey) the result is a polymer film with an initial quantum yield between approximately 65%-75%. On the other hand, when the three samples are fabricated without RAFT CTA (dark grey) the result is a polymer film with an initial quantum yield between approximately 52%-67%.

Figure 6A:
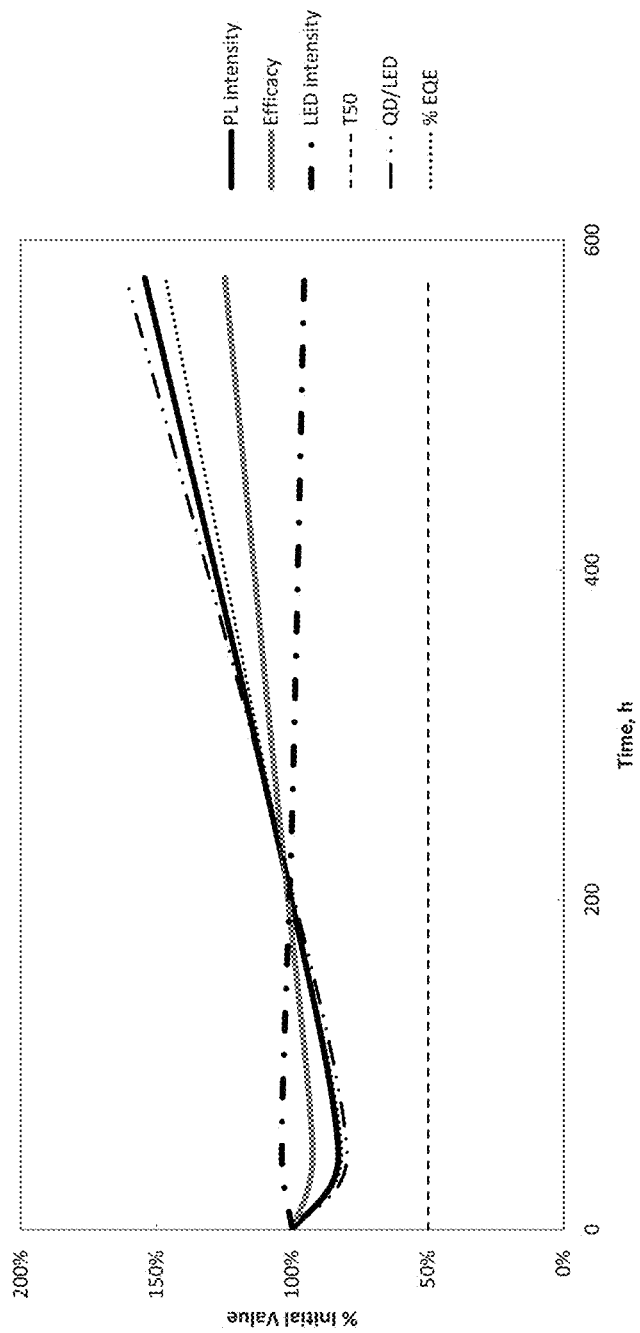
FIGS. 6A-6D illustrate the efficacy, percent photoluminescence intensity, QD/LED intensity, and LED intensity of a light emitting device coated with quantum dots films fabricated with an without RAFT CTA, in accordance with an embodiment of the invention.
Figure 6B:
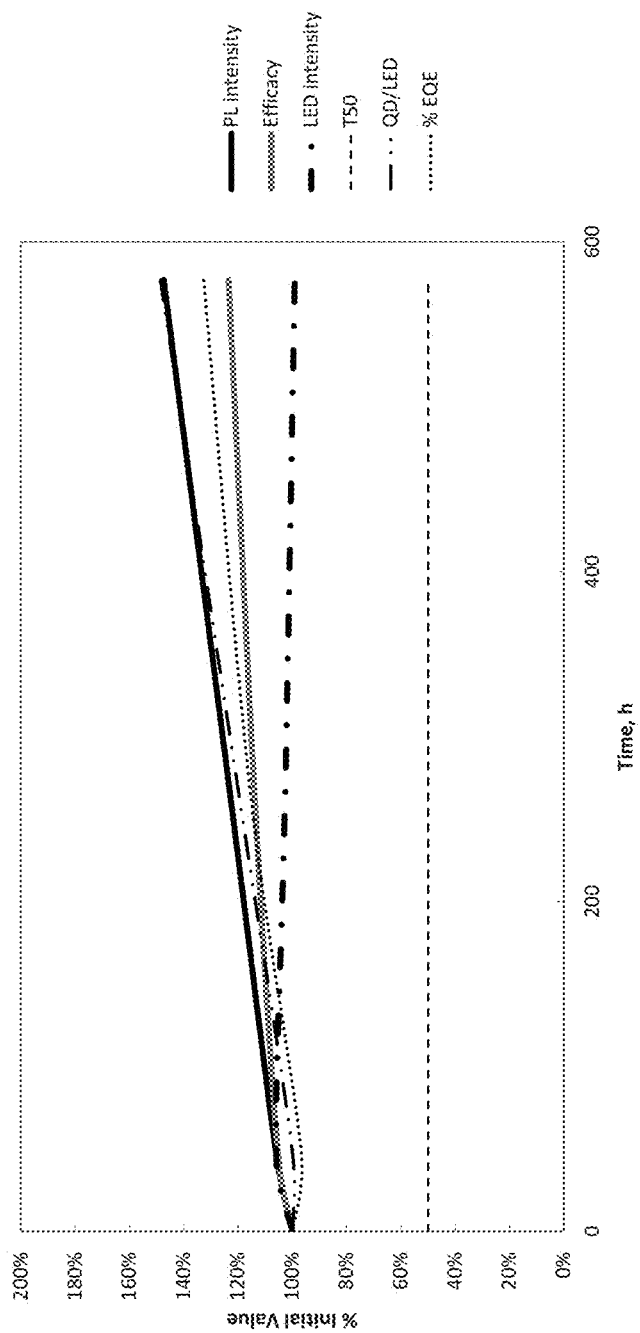
Figure 6C:
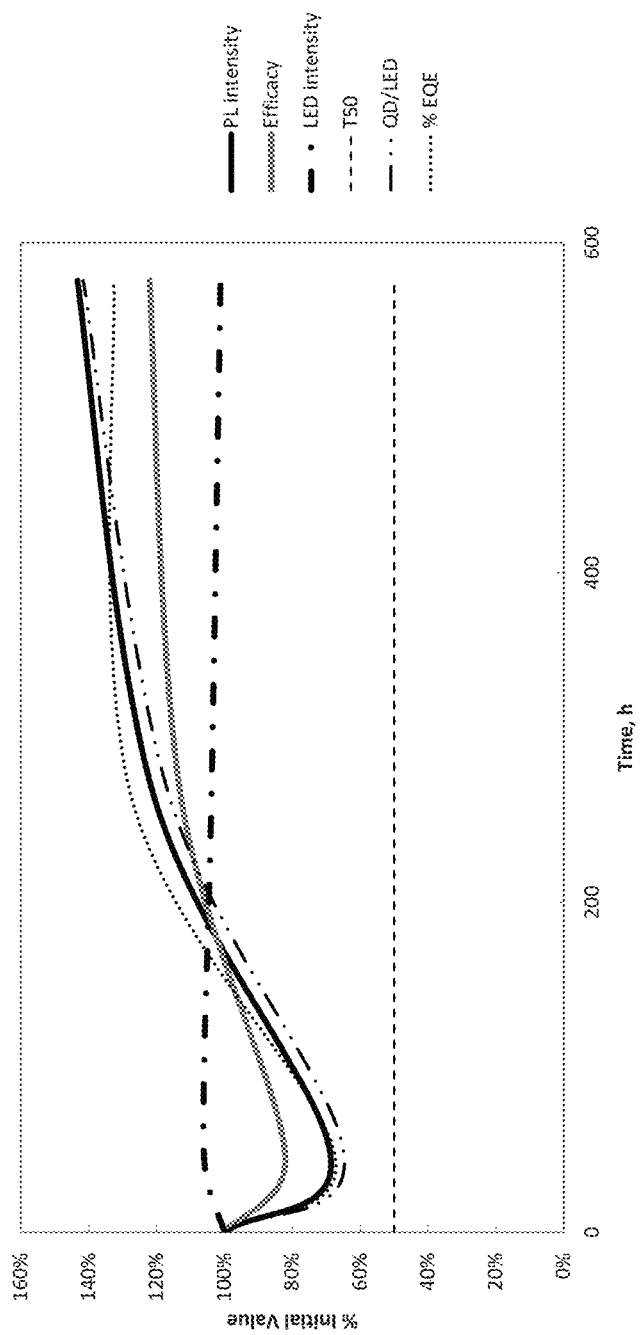
Figure 6D:
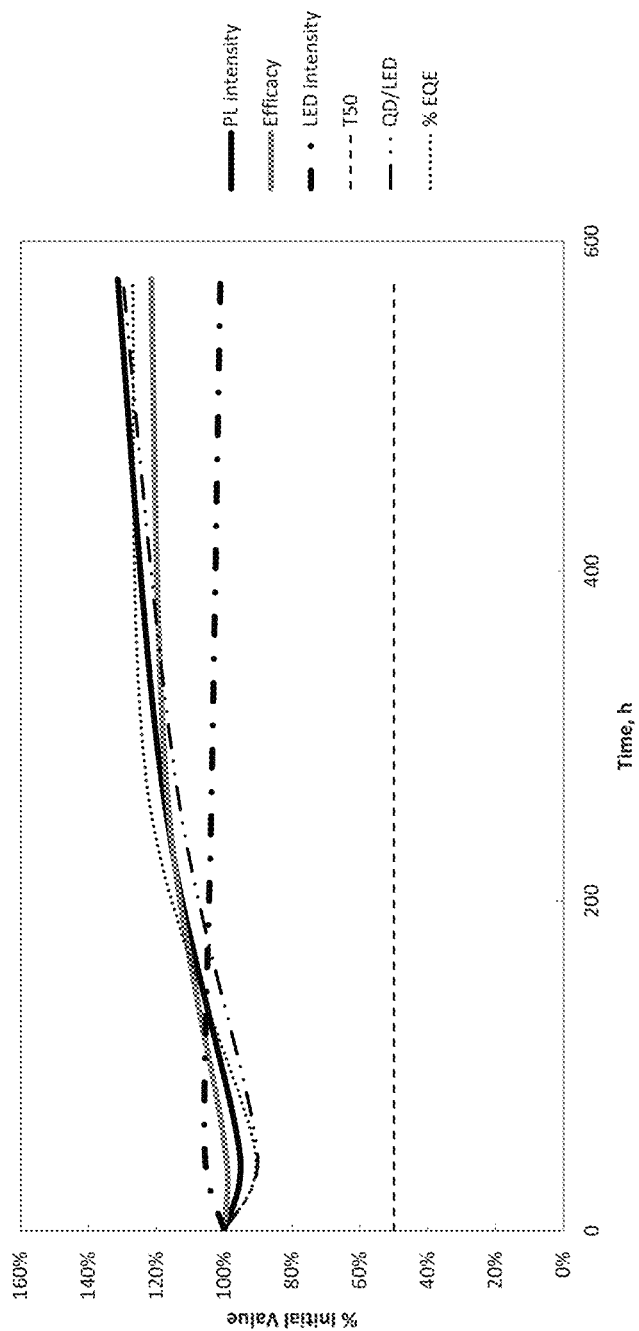

FIGS. 6A-6D illustrate the efficacy (solid grey curve, the brightness based on human eye sensitivity), percent photoluminescence intensity (black solid curve), QD/LED intensity, and LED intensity (black long-short-short-long dashed line) of a light emitting device coated with a film fabricated by the methods disclosed herein. FIGS. 6A and 6C illustrate test results on QD films without RAFT CTA. The films were tested at 65° C./0.23 mW/cm$^2$ (FIG. 6A) and 65° C./2.75 W/cm$^2$ (FIG. 6C). Results show an initial decrease in efficacy, PL intensity, and QD/LED intensity in the first 200 hours. FIGS. 6B and 6D illustrate test results on QD films with RAFT CTA. Again, the films were tested at 65° C./0.23 mW/cm$^2$ (FIG. 6B) and 65° C./2.75 W/cm$^2$ (FIG. 6D). Unlike films lacking RAFT CTA, films with RAFT CTA may show stability in efficacy, PL intensity, and/or QD/LED intensity during the first 200 hours. These results indicate that RAFT CTA can minimize QD damage from free radicals. For all results, efficacy, PL intensity, and QD/LED intensity may increase steadily after 200 hours. This may well be a result of photo-brightening.

FIG. 7 illustrates the quantum yield over time of QD films made with numerous radical scavengers, including cholesterol, guaiacol glyceryl ether (GGE), lipoic acid, non-reduced lipoic acid, 1-octadecane thiol, triphenyl phosphine, pyridoxine, 1-tetradecyl phosphonic acid, 2,2,6,6 tetramethyl 1-piperidinyloxy (TEMPO), triethyl phosphite, trioctyl phosphine, and β-carotene. The data illustrates that regardless of the addition of antioxidants and/or radical scavengers to the QD/polymer films, there may still be an observable decreases in the film's initial QY. Moreover, the QD films with antioxidants and/or radical scavengers did not show any improved stability compared with the control films, indicating these antioxidants/scavengers did not protect QDs from free radical damage. These results suggest that RAFT CTA may stabilize quantum dot films via a unique or different protecting mechanism.

In an embodiment, the afore-mentioned RAFT CTAs can be used to protect quantum dots or any other free radical sensitive materials (e.g., fluorescent materials such as OLEDs, dyes, etc.) from radical exposure in free radical-based polymerization reactions (polystyrene, polyacrylate, copolymers, etc).

There are numerous advantages to using chain transfer agents in the fabrication techniques described herein. For example, chain transfer agents are stable and commercially available for large scale syntheses. Furthermore, chain transfer agents like trithiocarbonates can suppress high concentrations of free radicals generated during film curing, film storage, or film use. This beneficial effect prevents these free radicals from damaging the quantum dots. See C-D. Vo et al., *Macromolecules*, 40, 7119 (2007); C-D. Vo et al., *J. Polym. Sci.* Part A Polym. Chem. 48, 2032 (2010). As a result, polymer films fabricated with RAFT CTAs can have higher and more stable quantum yields than films fabricated from standard resin formulations without RAFT CTA. In addition, RAFT CTAs offer higher degrees of crosslinking and polymerization without the generation of excess free radicals. For example, FIG. 8 presents the IR spectra of red-QDs in methacrylate resin before (upper spectrum) and after 5 min (lower spectrum) of UV irradiated with a mercury lamp. The peak at 1640 cm$^{-1}$ from vinyl methacrylate disappears in the lower spectrum, indicating the completion of photopolymerisation. Finally, RAFT CTAs that possess an aliphatic chain end ($C_{12}H_{25}$) that is highly compatible with lauryl methacrylate are covalently linked to polymer networks. This can lead to hybrid films having higher stability (non-bleaching additive) and flexibility.

It's understood that the above description is intended to be illustrative, and not restrictive. The material has been presented to enable any person skilled in the art to make and use the inventive concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the invention therefore should be determined with reference to the appended claims, along with the full scope of equivalents to which such claims are entitled. In the appended claims, the terms "including" and "in which" are used as the plain-English equivalents of the respective terms "comprising" and "wherein."

EXAMPLE

The following example may be used fabricate a quantum dot polymer film that includes any type of quantum dot or any combination of quantum dots. The examples are not intended to be limited to any particular quantum dots, solvents, methyl(acrylate) residues, or chain transfer agents.

Example 1: Preparation of a Red Cadmium-Free Quantum Dot Polymer Films

To a glass vial with a magnetic stirrer was added 18.2 mg, 0.05 mmol of RAFT CTA (2-(dodecylthiocarbonothioyl-thio)-2-methylpropionic acid). The vial was degassed via three cycles of vacuum and nitrogen. A toluene solution containing red cadmium-free quantum dots (red-QDs at 550 nm) was then combined with the RAFT CTA suspension. The resulting red-QD/RAFT CTA mixture was stirred under $N_2$ gas for 1 hr, or until the RAFT CTA was completely dissolved in the red-QD solution.

Next the toluene solvent was evaporated from the red-QD/RAFT CTA mixture at room temperature (20° C.) and then at 40° C. A mixture of lauryl methylacrylate (LMA) and phenylbis(2,4,6 trimethyl benzoyl)phosphine oxide (IRGACURE 819), previously mixed in dark conditions and degassed with nitrogen bubbles for 1 hr, was added to the red-QD/RAFT CTA dry residue and the resulting mixture was stirred under $N_2$ gas for 2 hours. Trimethyloyl propane (TMPTM), previously degassed with $N_2$ gas, was then added to the mixture and the suspension was stirred overnight under $N_2$ gas.

Finally, the suspension of red-QD/RAFT CTA/methy (acrylate) resins was transferred to a glass plate and irradiated with a mercury vapor or LED lamp in a glove box for 5 mins. The result was a high-quality, red-QD, polymer film.

The foregoing presents particular embodiments of a system embodying the principles of the invention. Those skilled in the art will be able to devise alternatives and variations which, even if not explicitly disclosed herein, embody those principles and are thus within the invention's spirit and scope. Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A method for fabricating quantum dot (QD) polymer films comprising:
    combining a quantum dot suspension with at least one chain transfer agent (CTA) to form a QD-CTA mixture;
    adding a methyl(acrylate) monomer, a photoinitiator, and a crosslinker to the QD-CTA mixture to form a QD-CTA-resin mixture;
    depositing the QD-CTA-resin mixture on a substrate; and
    curing the QD-CTA-resin mixture with UV light to form a film.

2. The method recited in claim 1 wherein the quantum dot suspension comprises toluene.

3. The method recited in claim 1 wherein the quantum dot suspension comprises an aliphatic hydrocarbon-based solvent.

4. The method recited in claim 1 wherein the chain transfer agent (CTA) is a trithiocarbonate.

5. The method recited in claim 1 wherein the chain transfer agent (CTA) is a reversible-addition fragmentation chain transfer agent (RAFT CTA).

6. The method recited in claim 5 wherein the RAFT CTA is 2-(dodecylthiocarbonothioylthio)-2-methylpropionic acid.

7. The method recited in claim 5 wherein the RAFT CTA is a thiocarbonylthio compound.

8. The method recited in claim 7 wherein the thiocarbonylthio compound is a dithiobenzoate.

9. The method recited in claim 7 wherein the thiocarbonylthio compound is a dithioester.

10. The method recited in claim 7 wherein the thiocarbonylthio compound is a dithiocarbamate.

11. The method recited in claim 7 wherein the thiocarbonylthio compound is a trithiocarbonate.

12. The method recited in claim 7 wherein the thiocarbonylthio compound is a xanthate.

13. The method recited in claim 5 wherein the RAFT CTA includes one or more carboxyl-terminated trithiocarbonates.

14. The method of claim 1, wherein the crosslinker is trimethyloylpropane trimethacrylate (TMPTM).

* * * * *